United States Patent
Li et al.

(10) Patent No.: US 9,553,188 B1
(45) Date of Patent: Jan. 24, 2017

(54) HIGH-VOLTAGE SEMICONDUCTOR DEVICE WITH FINGER-SHAPED INSULATION STRUCTURE

(71) Applicant: UNITED MICROELECTRONICS CORP., Hsin-Chu (TW)

(72) Inventors: Lingzi Li, Singapore (SG); Zhaobing Li, Singapore (SG); Hui Lu, Singapore (SG); Zhang Hu Sun, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 4 days.

(21) Appl. No.: 14/970,549

(22) Filed: Dec. 16, 2015

(30) Foreign Application Priority Data

Nov. 16, 2015 (TW) .............................. 104137645 A

(51) Int. Cl.
| | | |
|---|---|---|
| *H01L 29/78* | (2006.01) | |
| *H01L 29/06* | (2006.01) | |
| *H01L 29/08* | (2006.01) | |
| *H01L 29/40* | (2006.01) | |

(52) U.S. Cl.
CPC ....... *H01L 29/7835* (2013.01); *H01L 29/0607* (2013.01); *H01L 29/0653* (2013.01); *H01L 29/0847* (2013.01); *H01L 29/407* (2013.01)

(58) Field of Classification Search
CPC .. H01L 29/7835; H01L 29/78; H01L 29/0607; H01L 29/0653; H01L 29/0847; H01L 29/407; H01L 29/417
See application file for complete search history.

(56) References Cited

U.S. PATENT DOCUMENTS

| | | | | |
|---|---|---|---|---|
| 5,831,320 | A * | 11/1998 | Kwon | ............. H01L 21/823878 257/343 |
| 6,159,791 | A * | 12/2000 | Jeon | ........................ H01L 28/60 257/E21.011 |
| 8,143,123 | B2 * | 3/2012 | Grebs | ................. H01L 21/3065 257/341 |
| 8,704,304 | B1 | 4/2014 | Yu | |
| 8,766,358 | B2 | 7/2014 | Lee | |
| 2004/0256670 | A1 * | 12/2004 | Krumbein | ........... H01L 29/7835 257/336 |
| 2009/0140343 | A1 * | 6/2009 | Feilchenfeld | ......... H01L 29/407 257/367 |
| 2010/0067310 | A1 * | 3/2010 | Mazoyer | ............. H01L 29/0653 365/185.27 |
| 2011/0076822 | A1 * | 3/2011 | Denison | .............. H01L 29/0653 438/289 |

OTHER PUBLICATIONS

Hsiao, Title of Invention: Laterally Diffused Metal-Oxide-Semiconductor Transistor and Manufacturing Method Thereof, U.S. Appl. No. 14/886,108, filed Oct. 19, 2015.

* cited by examiner

*Primary Examiner* — John C Ingham
*Assistant Examiner* — Gustavo Ramallo
(74) *Attorney, Agent, or Firm* — Winston Hsu; Scott Margo

(57) ABSTRACT

A high-voltage semiconductor device includes a semiconductor substrate, a gate structure, a drain, an insulation structure, and a plurality of conductive structures. The insulation structure is disposed in the semiconductor substrate and disposed between the gate structure and the drain. The insulation structure includes a plurality of insulation units disposed separately from one another. Each of the conductive structures is embedded in one of the insulation units.

12 Claims, 6 Drawing Sheets

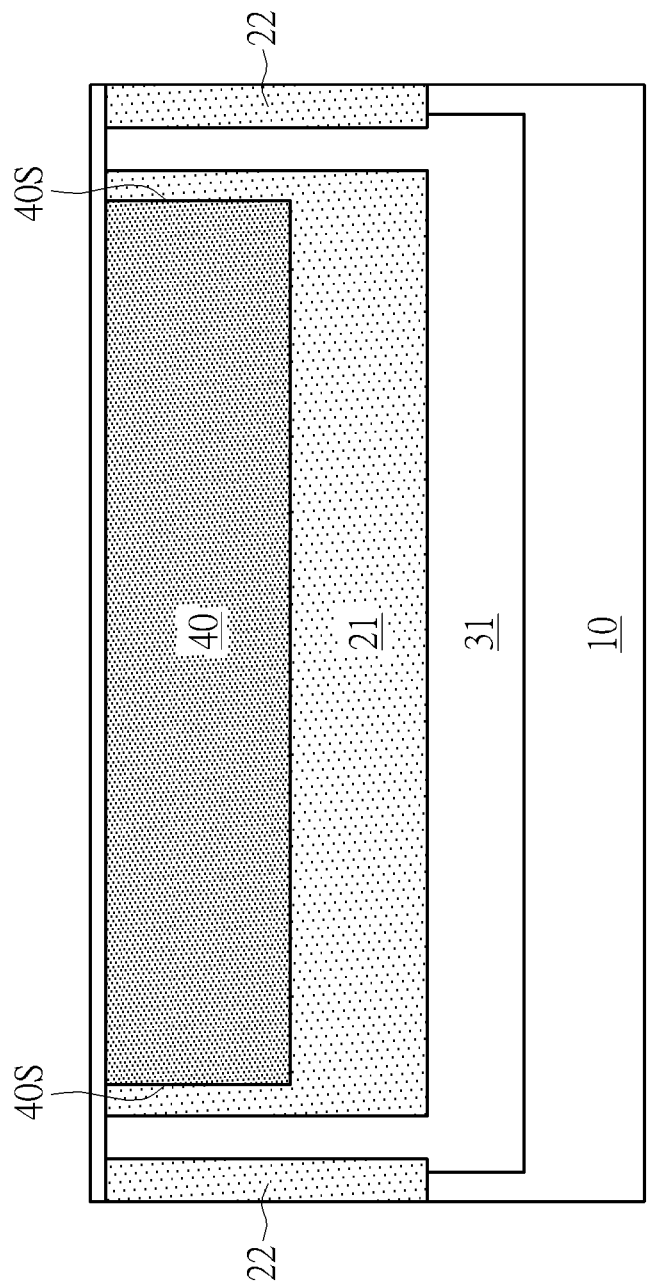
FIG. 3

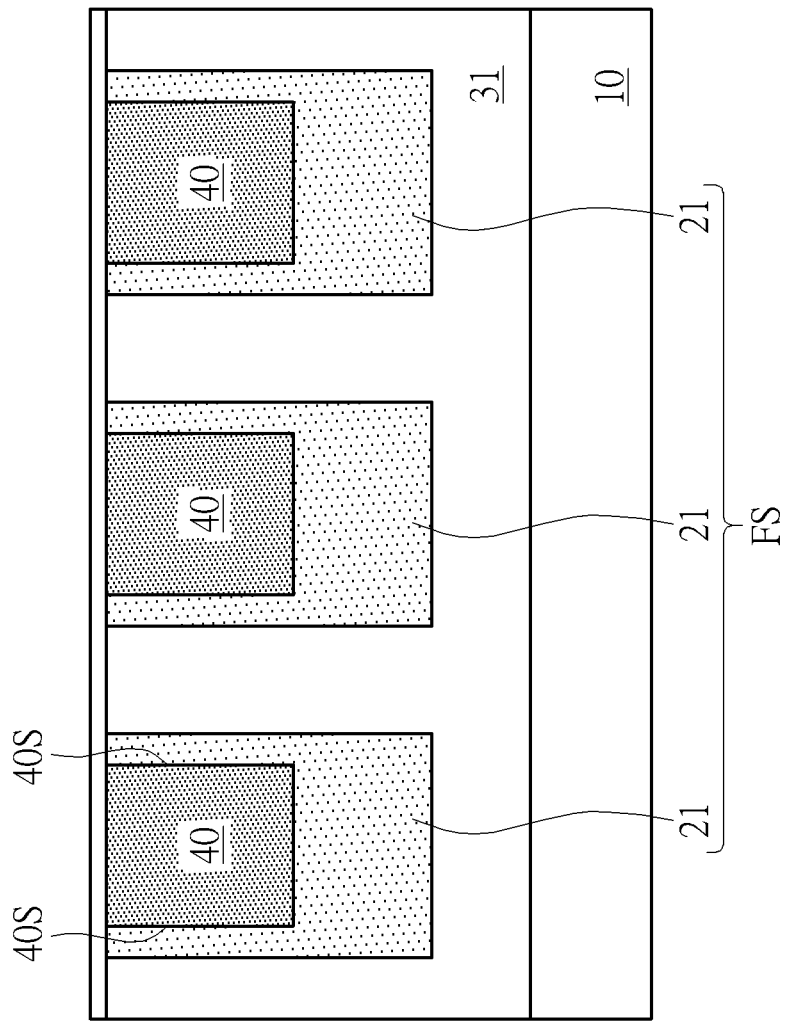
FIG. 6
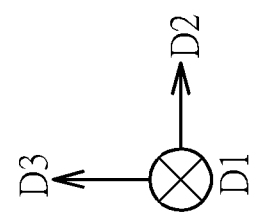

HIGH-VOLTAGE SEMICONDUCTOR DEVICE WITH FINGER-SHAPED INSULATION STRUCTURE

BACKGROUND OF THE INVENTION

1. Field of the Invention

The present invention relates to a high-voltage semiconductor device, and more particularly, to a high-voltage semiconductor device including a conductive structure embedded in an insulation unit between a gate structure and a drain.

2. Description of the Prior Art

With improvement in semiconductor manufacturing, it is conceivable to fabricate control circuits, memories, low-voltage circuits, high-voltage circuits, and the related devices in a single chip for reducing costs and improving performance. And a MOS transistor device, which is widely applied for enlarging currents or signals in a circuit, serving as an oscillator of a circuit, or serving as a switch device of a circuit, is further applied to be the high power device or the high-voltage device based on the development of semiconductor processes. For example, a MOS transistor device, serving as a high-voltage device, is applied in between the internal circuits and the I/O terminals for preventing a large number of charges from suddenly spiking into the internal circuits and thus to avoid the resulted damage to the internal circuit. Additionally, the high-voltage device may also be applied to serve as a program/erase driver in an embedded nonvolatile memory (eNVM) or be applied in a LCD driver to modulate greyscale signals.

In the conventional high-voltage MOS transistor device, the breakdown voltage is enhanced by lowering the lateral electrical field. The types of the conventional high-voltage MOS transistor devices substantially include the high-voltage MOS transistor device with a drift region, such as a double diffused drain MOS (DDDMOS) transistor device and a laterally diffused drain MOS (LDMOS) transistor device and the high-voltage MOS transistor device with shallow trench isolation (STI) disposed at the drain side, such as a field diffused drain MOS (FDMOS) transistor device and a drain extended MOS (DEMOS) transistor device. However, many parts of the structures described above, such as the gate structure, the source region, the drain region, the N-type well, and/or the P-type well, require a specific size for providing sufficient robustness for high voltage. Therefore the high-voltage MOS transistor device often occupies the valuable spaces on the chip and adversely influences integrity level. Additionally, the drain-source-on-state resistance ($R_{on}$) will increase while the device area of the high-voltage MOS transistor device increases, and it is difficult to lower the drain-source-on-state resistance of the high-voltage MOS transistor device such as the LDMOS transistor device mentioned above.

SUMMARY OF THE INVENTION

A high-voltage semiconductor device is provided in the present invention. An insulation unit is formed in a semiconductor substrate between a gate structure and a drain, and a conductive structure is embedded in the insulation unit. By controlling the electrical potential of the conductive structure embedded in the insulation unit, the breakdown voltage of the high-voltage semiconductor device may be improved, and the drain-source-on-state resistance of the high-voltage semiconductor device may be reduced accordingly.

According to an embodiment of the present invention, a high-voltage semiconductor device is provided. The high-voltage semiconductor device includes a semiconductor substrate, a gate structure, a drain, an insulation structure, and a plurality of conductive structures. The gate structure is disposed on the semiconductor substrate. The drain is disposed in the semiconductor substrate. The insulation structure is disposed in the semiconductor substrate and disposed between the gate structure and the drain. The insulation structure includes a plurality of insulation units separated from one another. Each of the conductive structures is embedded in one of the insulation units.

In the high-voltage semiconductor device of the present invention, the conductive structure is embedded in the insulation structure between the gate structure and the drain, and the electrical potential of the conductive structure is controlled to improve the breakdown voltage and/or reduce the drain-source-on-state resistance. The electrical characteristics of the high-voltage semiconductor device may be improved without increasing the area of the device too much relatively, and the high-voltage semiconductor device may be applied in advanced process nodes, such as the 28 nm process node and beyond.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a cross-sectional diagram taken along a line B-B' in FIG. 1.

FIG. 6 is a cross-sectional diagram taken along a line D-D' in FIG. 4.

DETAILED DESCRIPTION

Figure 1:
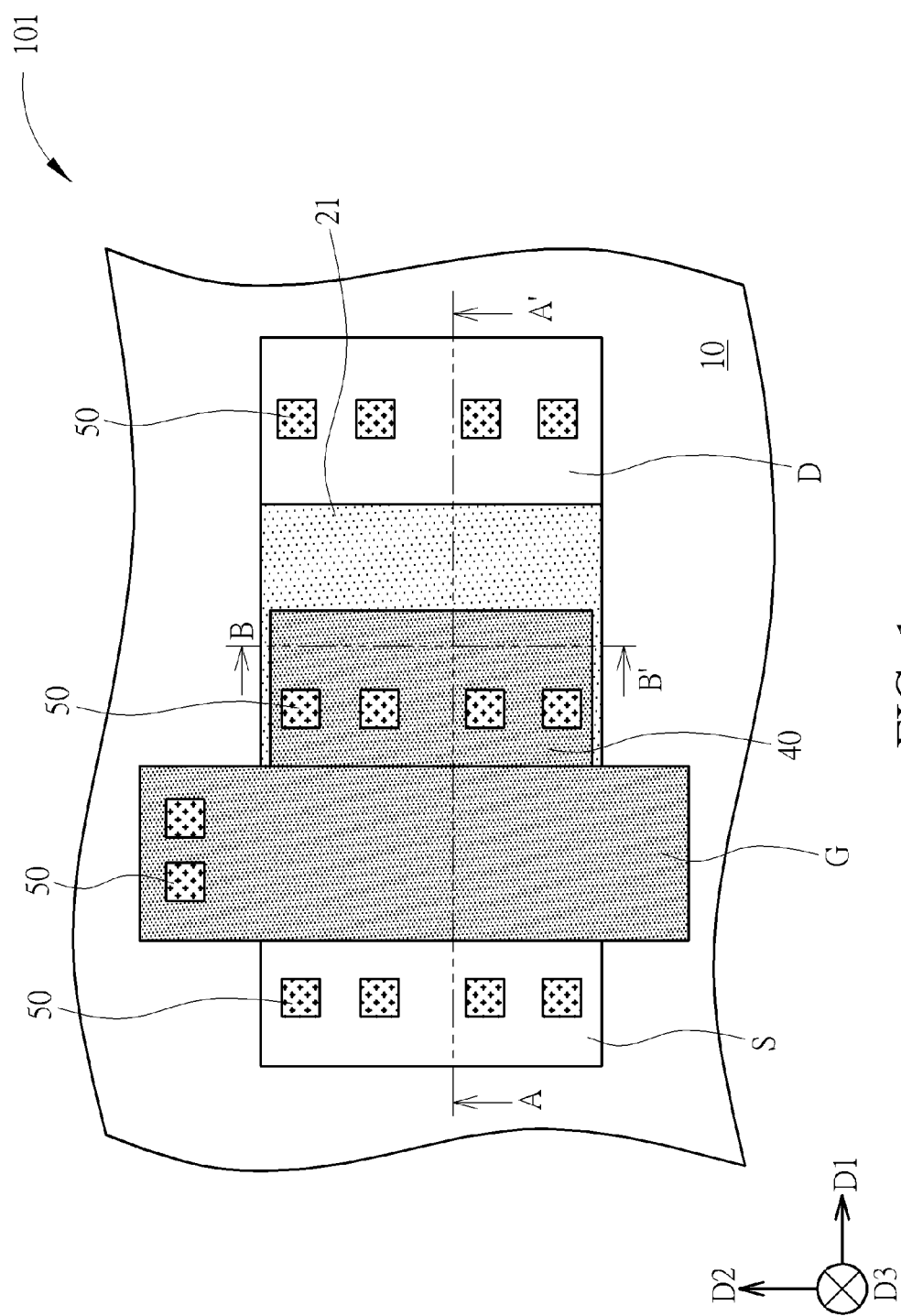
FIG. 1 is a schematic drawing illustrating a high-voltage semiconductor device according to a first embodiment of the present invention.
Figure 2:
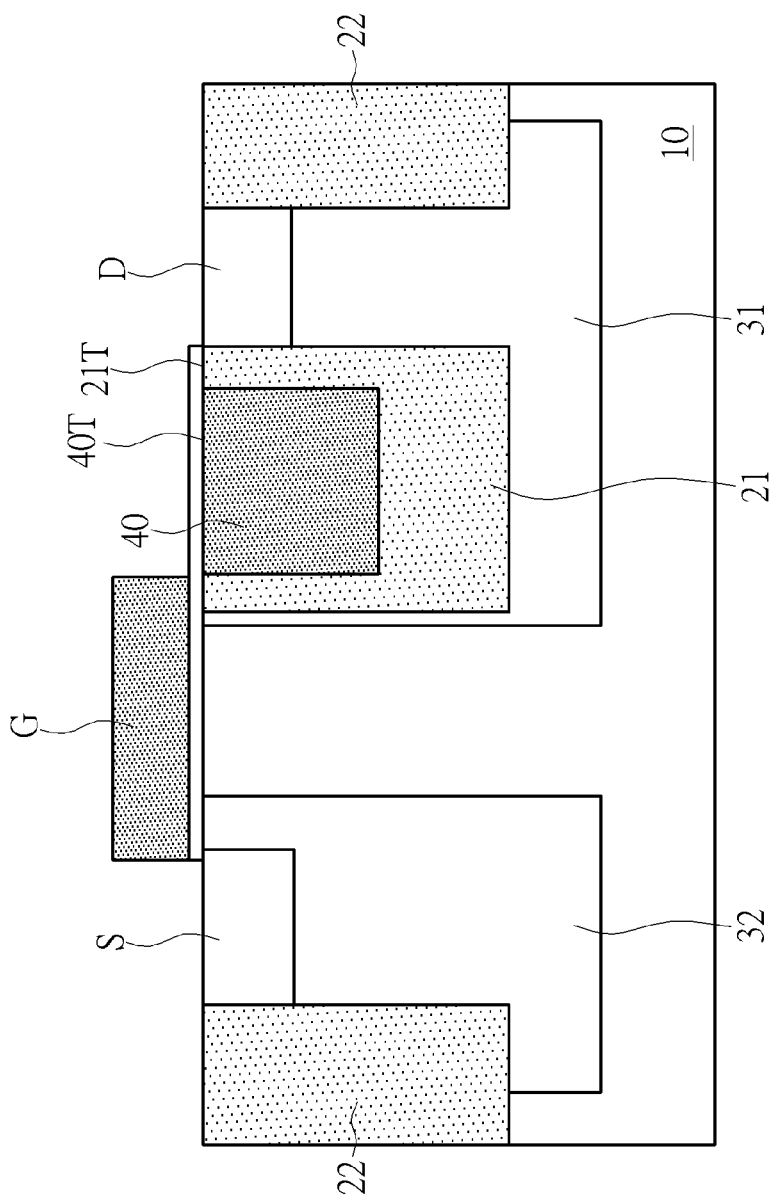
FIG. 2 is a cross-sectional diagram taken along a line A-A' in FIG. 1.

Please refer to FIG. 1, FIG. 2, and FIG. 3. FIG. 1 is a schematic drawing illustrating a high-voltage semiconductor device according to a first embodiment of the present invention, FIG. 2 is a cross-sectional diagram taken along a line A-A' in FIG. 1, and FIG. 3 is a cross-sectional diagram taken along a line B-B' in FIG. 1. As shown in FIG. 1, FIG. 2, and FIG. 3, a high-voltage semiconductor device 101 is provided in this embodiment. The high-voltage semiconductor device 101 includes a semiconductor substrate 10, a gate structure G, a drain D, a source S, an insulation unit 21, and a conductive structure 40. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The gate structure G is disposed on the semiconductor substrate 10. The drain D and the source S are disposed in the semiconductor substrate at two opposite sides of the gate structure G in a first direction D1. The insulation unit 21 is disposed in the semiconductor substrate 10, and the insulation unit 21 is disposed between the gate structure G and the drain D in the first direction D1. The conductive structure 40 is embedded in the insulation unit 21. In this embodiment, the gate structure G may include a polysilicon gate, a metal gate, or gate structures formed by other appropriate materials. The conductive structure 40 may also include a polysilicon conductive structure, a metal conductive structure, or conductive structures formed by other appropriate materials. The insulation unit 21 may include a shallow trench insolation (STI) structure formed by forming a trench in the semiconductor substrate 10 and filling the trench with an insulation material. Therefore, the insulation unit 21 and other required STI structures in the semiconductor substrate 10 (such as a STI 22 surrounding the gate structure G, the source S, and the drain D in FIG. 2) may be formed together, but not limited thereto. In other embodiments of the present invention, the insulation unit 21 may also include a field oxide (FOX) formed by a local oxidation of silicon (LOCOS) process or other appropriate insulation units.

In this embodiment, the conductive structure 40 may be formed by forming a trench in the insulation unit 21 and filling the trench with a conductive material. After the trench is filled with the conductive material, a planarization process and/or an etching back process may be performed to remove an unnecessary part of the conductive material. Accordingly, a top surface of the conductive structure 40 (such as a first top surface 40T shown in FIG. 2) and a top surface of the insulation unit 21 (such as a second top surface 21T shown in FIG. 2) are kept on the same level and coplanar, but not limited thereto. In other embodiments of the present invention, the first top surface 40T of the conductive structure 40 may also be slightly lower than the second top surface 21T of the insulation unit 21 according to other considerations. The conductive structure 40 is embedded in the insulation unit 21, and all surfaces of the conductive structure 40 except the first top surface 40T are surrounded by and contact the insulation unit 21 preferably, but the present invention is not limited to this. In other embodiments of the present invention, a part of the side surface of the conductive structure 40 (such as a side surface 40S in a second direction D2 shown in FIG. 3) may also be exposed from the insulation unit 21 according to other considerations, but the side surface 40S will still be covered by the STI 22.

In this embodiment, the high-voltage semiconductor device 101 may further include a first well 31 and a second well 32 disposed in the semiconductor substrate 10 at on two opposite sides of the gate structure G in the first direction D1, and a conductivity type of the first well 31 is different from a conductivity type of the second well 32. For example, the semiconductor substrate 10 may include a first conductivity type or a second conductivity type complementary to the first conductivity type. The first well 31 may have the first conductivity type (such as an N-type), the second well 32 may have the second conductivity type (such as a P-type), the drain D and the source S may be a doped region having the first conductivity type respectively, and the doping concentration of the drain D and the source S may be higher than the doping concentration of the first well 31, but not limited thereto. In other embodiments of the present invention, the first conductivity type may be the P-type, and the second conductivity type may be the N-type for forming different high-voltage semiconductor device. In this embodiment, the drain D, the insulation unit 21, and the conductive structure 40 may be disposed in the first well 31, and the source S may be disposed in the second well 32. In addition, the gate structure G in this embodiment overlaps a part of the insulation unit 21 and a part of the first well 31 in a vertical direction D3, and the region of the first well 31 overlapped by the gate structure G may be used as a channel region of the high-voltage semiconductor device 101.

It is worth noting that in this embodiment, corresponding contact plugs 50 may be formed on the gate structure G, the source S, the drain D, and the conductive structure 40 respectively, the electrical potential of the conductive structure 40 may be independently controlled for modulating the electrical field between the gate structure G, the drain D, and the semiconductor substrate 10 accordingly, and the wanted electrical performance may be achieved. For example, the breakdown voltage of the high-voltage semiconductor device 101 may be enhanced by improving the high electrical field of the region adjacent to the drain D, the insulation unit 21, and the first well 31 when the electrical potential of the conductive structure 40 is equal to the electrical potential of the drain D and/or a high electrical potential is applied to the conductive structure 40. For instance, the operation electrical potential of the source S may range between 0 and 2.5 volts, the operation electrical potential of the drain D may range between 9 volts to 60 volts, and the operation electrical potential of conductive structure 40 may be 9 volts. However, in this condition, the drain-source-on-state-resistance ($R_{on}$) may be higher relatively. In another condition, the conductive structure 40 may be electrically floating, the electrical potential of the conductive structure 40 may be different from the electrical potential of the gate structure G and/or the electrical potential of the drain D, and a relatively lower drain-source-on-state-resistance and a relatively lower breakdown voltage may be achieved under this condition. There is no additional process step required in the above-mentioned method of modulating the drain-source-on-state-resistance and the breakdown voltage, and the semiconductor device is not limited to be used as the high-voltage device and may also be applied in other circuits such as an electrostatic discharge (ESD) protection circuit. Additionally, in further another condition, the breakdown voltage and the drain-source-on-state-resistance of the high-voltage semiconductor device 101 may be improved more balancedly when the electrical potential of the gate structurer 40 is equal to the electrical potential of the gate structure G. Therefore, the electrical potential of the conductive structure 40 in this embodiment may be modified according to the design requirements of the high-voltage semiconductor device 101, and the demanded electrical performance of the high-voltage semiconductor device 101 may be achieved. In this embodiment, the breakdown voltage of the high-voltage semiconductor device 101 is improved by controlling the electrical potential of the conductive structure 40 embedded in the insulation unit 21, and the sizes of the other parts (such as the drain D, the insulation unit 21, and/or the first well 31) may not be limited to be kept in some specific sizes for enough high-voltage withstand ability. Therefore, the possibility of further shrinking the size of the high-voltage semiconductor device 101 may be enhanced, and the high-voltage semiconductor device 101 may be applied in advanced process nodes, such as the 28 nm process node and beyond.

Figure 4:
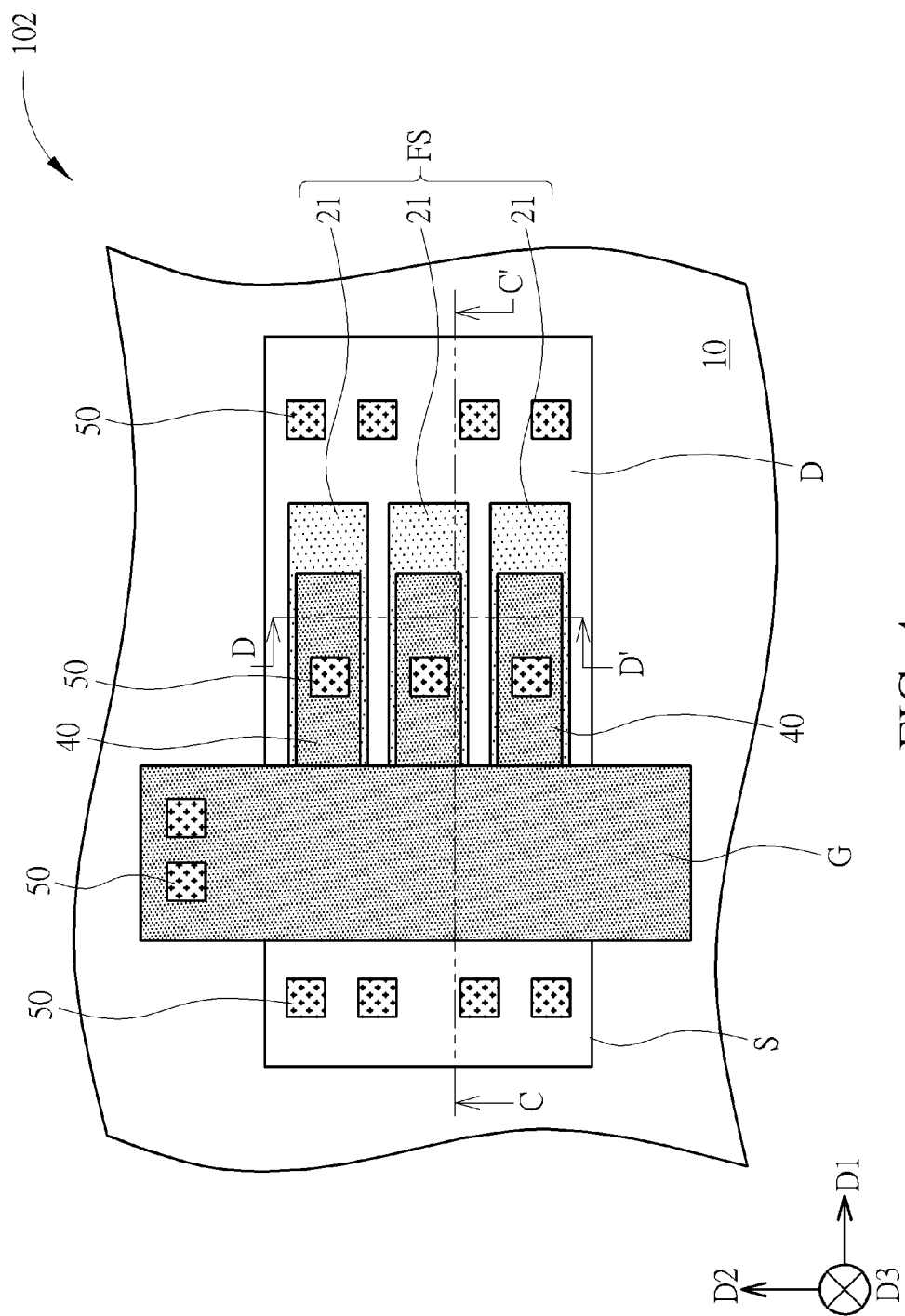
FIG. 4 is a schematic drawing illustrating a high-voltage semiconductor device according to a second embodiment of the present invention.
Figure 5:
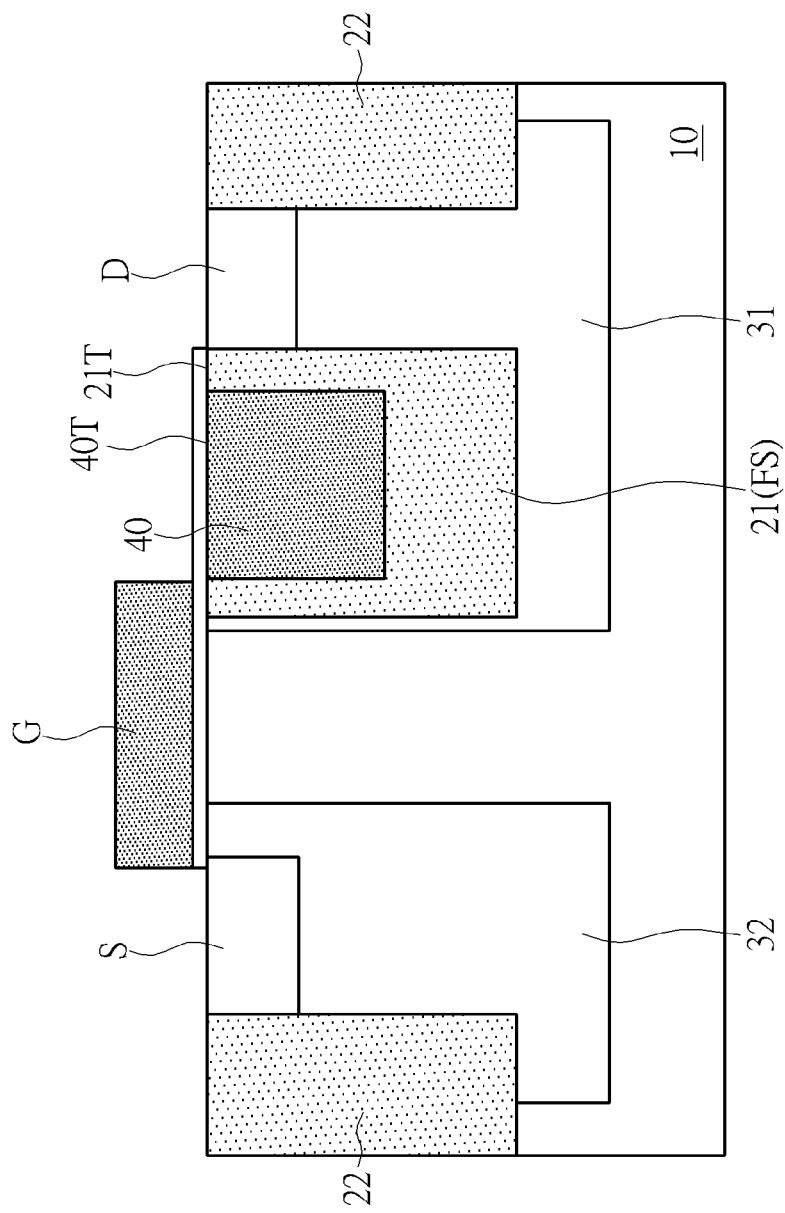
FIG. 5 is a cross-sectional diagram taken along a line C-C' in FIG. 4.

Please refer to FIG. 4, FIG. 5, and FIG. 6. FIG. 4 is a schematic drawing illustrating a high-voltage semiconductor device according to a second embodiment of the present invention, FIG. 5 is a cross-sectional diagram taken along a line C-C' in FIG. 4, and FIG. 6 is a cross-sectional diagram taken along a line D-D' in FIG. 4. As shown in FIG. 4, FIG. 5, and FIG. 6, a high-voltage semiconductor device 102 is provided in this embodiment. The high-voltage semiconductor device 102 includes the semiconductor substrate 10, the gate structure G, the drain D, an insulation structure FS, and a plurality of the conductive structures 40. The gate structure G is disposed on the semiconductor substrate 10, and the drain D is disposed in the semiconductor substrate 10. The insulation structure FS is disposed in the semiconductor substrate 10 and disposed between the gate structure G and the drain D. The gate structure G overlaps a part of the insulation structure FS in the vertical direction D3. Additionally, the high-voltage semiconductor device 102 may further include the source S, the first well 31, and the second well 32. The insulation structure FS and the drain D are disposed in the first well 31. In this embodiment, the technical features and materials properties of the parts similar to those in the first embodiment have been described above and will not be redundantly described. The difference between this embodiment and the first embodiment mentioned above is that the insulation structure FS in this embodiment includes a plurality of the insulation units 21 disposed separately from one another. Each of the conductive structures 40 is embedded in one of the insulation units 21. The top surface of each of the conductive structures 40 and the top surface of the insulation unit 21 corresponding to the conductive structure 40 are aligned at the same level and coplanar, but the present invention is not limited to this. In other embodiments of the present invention, the top surface of the conductive structure 40 may also be slightly lower than the top surface of the insulation unit 21 according to other considerations. The insulation structure FS is disposed between the gate structure G and the drain D in the first direction D1, and the insulation units 21 of the insulation structure FS are repeatedly disposed in the second direction D2. The first direction D1 is not parallel to the second direction D2, and the first direction D1 may be perpendicular to the second direction D2 for example, but not limited thereto. Each of the insulation units 21 may extend in the first direction D1, and the insulation structure FS may be regarded as a finger-shaped insulation structure.

In this embodiment, except the first top surface 40 T of each conductive structure 40 in the insulation 21, other surfaces of the conductive structure 40 are surrounded by and touch the corresponding insulation unit 21 preferably. The electrical potential of the conductive structures 40 in the insulation units 21 may be independently controlled for modulating the electrical field between the gate structure G, the drain D, and the semiconductor substrate 10, and the wanted electrical performance may be achieved accordingly. The modification approach about the electrical potential of the conductive structure 40 is detailed in the first embodiment mentioned above and will not be redundantly described. It is worth noting that a part of the first well 31 is disposed between two adjacent insulation units 21 in the insulation structure FS because the insulation structure FS is a finger-shaped insulation structure including a plurality of the insulation units 21 and each of the insulation units extends in the first direction D1. The purposes of lowering the drain-source-on-state-resistance and enhancing the operation current may be achieved by the finger-shaped insulation structure and the conductive structures 40 embedded in the insulation units 21 respectively.

To summarize the above descriptions, in the high-voltage semiconductor device of the present invention, by disposing the conductive structure embedded in the insulation unit between the gate structure and the drain and controlling the electrical potential of the conductive structure, the breakdown voltage and other electrical properties of the high-voltage semiconductor device may be improved without increasing the size of the high-voltage semiconductor device. Therefore, the high-voltage semiconductor device of the present invention may be applied in the advanced process nodes. In addition, the finger-shaped insulation structure including a plurality of the insulation units is further applied in the present invention for lowering the drain-source-on-state-resistance of the high-voltage semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage semiconductor device, comprising:
a semiconductor substrate;
a gate structure disposed on the semiconductor substrate;
a drain disposed in the semiconductor substrate;
an insulation structure disposed in the semiconductor substrate and disposed between the gate structure and the drain, wherein the insulation structure comprises a plurality of insulation units separated from one another; and
a plurality of conductive structures, wherein each of the conductive structures is embedded in one of the insulation units, and a topmost surface of each of the conductive structures and a topmost surface of the insulation unit corresponding to the conductive structure are coplanar.

2. The high-voltage semiconductor device of claim 1, wherein the conductive structure is disposed between the gate structure and the drain in a first direction, and the insulation units of the insulation structure are repeatedly disposed in a second direction.

3. The high-voltage semiconductor device of claim 2, wherein the first direction is perpendicular to the second direction.

4. The high-voltage semiconductor device of claim 2, wherein each of the insulation units extends in the first direction, and the insulation structure comprises a finger-shaped insulation structure.

5. The high-voltage semiconductor device of claim 1, wherein an electrical potential of each of the conductive structures is equal to an electrical potential of the gate structure.

6. The high-voltage semiconductor device of claim 1, wherein an electrical potential of each of the conductive structures is equal to an electrical potential of the drain.

7. The high-voltage semiconductor device of claim 1, wherein an electrical potential of each of the conductive structures is different from an electrical potential of the gate structure and/or an electrical potential of the drain.

8. The high-voltage semiconductor device of claim 1, wherein the gate structure overlaps a part of the insulation structure in a vertical direction.

9. The high-voltage semiconductor device of claim 1, further comprising:
a first well disposed in the semiconductor substrate; and
a second well disposed in the semiconductor substrate, wherein the first well and the second well are disposed in the semiconductor substrate at on two opposite sides of the gate structure, and a conductivity type of the first well is different from a conductivity type of the second well.

10. The high-voltage semiconductor device of claim 9, wherein the drain and the insulation structure are disposed in the first well.

11. The high-voltage semiconductor device of claim 10, wherein a part of the first well is disposed between two adjacent insulation units in the insulation structure.

12. The high-voltage semiconductor device of claim 9, further comprising a source disposed in the second well.

* * * * *